(12) United States Patent
Ochi

(10) Patent No.: US 7,882,957 B2
(45) Date of Patent: Feb. 8, 2011

(54) STORING TRAY AND STORING DEVICE

(75) Inventor: Takao Ochi, Shiga-gun (JP)

(73) Assignee: Panasonic Corporation, Osaka (JP)

( * ) Notice: Subject to any disclaimer, the term of this patent is extended or adjusted under 35 U.S.C. 154(b) by 992 days.

(21) Appl. No.: 11/210,866

(22) Filed: Aug. 25, 2005

(65) Prior Publication Data

US 2006/0054532 A1 Mar. 16, 2006

(30) Foreign Application Priority Data

Sep. 10, 2004 (JP) .............................. 2004-263136

(51) Int. Cl.
*B65D 85/00* (2006.01)
*B65D 21/00* (2006.01)
*B65D 85/62* (2006.01)

(52) U.S. Cl. ..................... 206/711; 206/725; 206/515

(58) Field of Classification Search ............. 206/725, 206/564, 518, 515, 722, 710–712, 832, 503, 206/505, 509, 511, 512

See application file for complete search history.

(56) References Cited

U.S. PATENT DOCUMENTS

| 3,200,943 | A | * | 8/1965 | Waterbury | 206/523 |
|---|---|---|---|---|---|
| 3,282,458 | A | * | 11/1966 | Arthur | 217/26.5 |
| 4,711,356 | A | * | 12/1987 | Dunden | 206/503 |
| 5,400,904 | A |   | 3/1995 | Maston, III et al. | 206/329 |
| 5,481,438 | A | * | 1/1996 | Nemoto | 361/810 |
| 5,890,599 | A | * | 4/1999 | Murphy | 206/725 |
| 5,957,293 | A | * | 9/1999 | Pakeriasamy | 206/725 |
| 6,296,122 | B1 | * | 10/2001 | Nakazono et al. | 206/707 |
| 6,612,442 | B2 | * | 9/2003 | Soh et al. | 206/725 |
| 6,820,743 | B2 | * | 11/2004 | Hurley et al. | 206/427 |
| 7,163,104 | B2 | * | 1/2007 | Inoke et al. | 206/726 |
| 2003/0012628 | A1 | * | 1/2003 | Nigg et al. | 414/222.01 |
| 2004/0206661 | A1 | * | 10/2004 | Gardiner et al. | 206/701 |

FOREIGN PATENT DOCUMENTS

| CN | 2623644 Y | 7/2004 |
|---|---|---|
| JP | 60-179098 | 11/1985 |
| JP | 62-69486 | 5/1987 |
| JP | 2-138191 | 11/1990 |
| JP | 09-150884 | 6/1997 |
| JP | 10-329886 | 12/1998 |
| JP | 2002-302192 | 10/2002 |
| JP | 2002-362679 | 12/2002 |
| WO | WO 9810687 A1 * | 3/1998 |

* cited by examiner

*Primary Examiner*—Mickey Yu
*Assistant Examiner*—Melissa L Lalli
(74) *Attorney, Agent, or Firm*—Steptoe & Johnson LLP

(57) ABSTRACT

An object of the present invention is to provide a storing tray and a storing device whereby an object such as an electronic component to be stored can be picked up in a preferred manner and a plurality of stored objects can be flipped and transferred at once. Another object is to form the storing tray as a soft tray. The storing tray includes a storing part on its main surface, the storing part including a storing base for placing therein an object such as an electronic component, a plurality of convex portions formed along the outer periphery of the storing base to protrude upward more than the storing base, and concave portions formed along the outer periphery of the storing base between the plurality of convex portions to be recessed downward more than the storing base. The storing tray has an uneven back surface opposite in shape to the main surface.

11 Claims, 9 Drawing Sheets

STORING TRAY AND STORING DEVICE

FIELD OF THE INVENTION

The present invention relates to a storing tray and a storing device for storing an electronic component or the like, and more particularly, to the structure of a tray for storing an electronic component such as a semiconductor package.

BACKGROUND OF THE INVENTION

In recent years, more rational packaging at lower cost has been demanded as well as miniaturization, mass production, and low cost, for electronic components such as semiconductor packages.

Packaging with trays is generally used for semiconductor packages and so on. Products are stored in the storage pockets of trays, the trays are stacked, and the stacked trays are bound. Then, the trays are put into an outer case such as a carton case, so that packaging is completed.

Such trays are broadly divided into a hard tray and a soft tray. A hard tray is formed by transfer mold. In this molding method, a plastic such as polystyrene or polypropylene is softened by heating, press-fit into a cope and a drag, and hardened therein. A complicated three-dimensional object can be formed with high stiffness and high accuracy.

A soft tray is formed by vacuum forming. In this molding method, a plate made of a plastic such as polystyrene is pressed to a die by pulling a vacuum between the die and one side of the plate while the plate is softened at a high temperature, so that the plate is bent. The processing accuracy of a soft tray is lower than that of a hard tray and thus a soft tray cannot form a complicated three-dimensional object. Further, a soft tray has a small thickness, resulting in low strength. However, a soft tray has advantages of a light weight and low cost. Moreover, highly inexpensive dies are available on short lead times, and thus a flexible response can be made.

For this reason, there is a vocal demand to use hard trays for semiconductor packages having external leads and electronic components requiring high accuracy and to use soft trays as much as possible for semiconductor packages having no external leads and electronic components not requiring high accuracy, in consideration of cost, delivery time, flexibility and so on.

Semiconductor packages are stored with main surfaces face up or stored with back surfaces face up. Thus, it is necessary to flip electronic components one by one according to the orientation and transfer the electronic components to another tray. For example, in the case of a surface-mounting semiconductor package of LGA, BGA, and so on, a main surface has a body of molded portions and a back surface has external terminals. Thus, electronic components are flipped one by one and transferred to another tray depending upon whether the main surface or the back surface is arranged face up. Hence, there is a particularly strong demand to avoid complicated operations.

A tray meeting the demand is disclosed in, for example, Japanese Patent No. 2852872. FIG. 9 is a simple illustration of this tray. FIG. 9A is a plan view showing the main surface of the tray. FIG. 9B is a plan view showing the back surface of the tray. FIG. 9C is a sectional view taken along line A-A of FIG. 9A. FIG. 9D shows stacked trays.

A tray 20 is a hard tray formed by transfer mold. First storing parts 21 are formed on the main surface of the tray and second storing parts 22 are formed on the back surface of the tray. The first storing parts 21 and the second storing parts 22 of similar size are formed on opposite positions of the tray. The four storing parts are arranged in two rows and columns in parallel.

In the first storing part 21, on the outer periphery of a rectangular storage pocket 23, a convex portion 24 is formed like a letter L along the corner of the storage pocket 23. Between the convex portions 24, a concave portion 25 is formed along the central portion of a side of the storage pocket 23. In the second storing part 22, on the outer periphery of a rectangular storage pocket 26, a convex portion 27 is formed along the central portion of a side of a storage pocket 26 so as to be engaged with the convex portion 24 and the concave portion 25 on the outer periphery of the first storage part 21. Between the convex portions 27, a concave portion 28 is formed like a letter L along a corner of the storage pocket 26. Ribs 29 extending along the thickness direction of the tray are formed on both edges of the convex portion 24 facing the storage pocket 23 and both edges of the concave portion 28 facing the storage pocket 26.

With this configuration, the inner surfaces of the convex portions 24 and 27 are brought into contact with the outer edges of an electronic component 30 to be stored in the storage pockets 23 and 26, so that the position of the electronic component 30 is regulated in the plane direction. Further, the ends of the ribs 29 are brought into contact with the outer edges of the main surface or the back surface of the electronic component 30 stored in the storage pockets 23 and 26, so that the position of the electronic component 30 is regulated in the height direction in the storage pockets 23 and 26.

As shown in FIG. 9D, when the trays 20 are vertically stacked, the convex portions 24 and the concave portions 25 of the first storing part 21 and the concave portions 28 and the convex portions 27 of the second storing part 22 are engaged with each other so as to position the upper and lower trays 20. The electronic components 30 are stored in the first storing parts 21 with the main surfaces face up and also stored in the second storing parts 22. By flipping the stacked trays 20, the electronic components 30 can be flipped at once and transferred to the second storing parts 22.

Generally, as an efficient positioning method for picking up an electronic component from a tray and mounting the electric component onto another electronic component, the outer edge of the electronic component is held and is transferred directly to another electronic component. In this method, the conventional tray 20 has the following problems in shape:

First, the convex and concave portions around the storage pockets 23 and 26 of the first storing part 21 on the main surface and the second storing part 22 on the back surface are considerably different from each other. The holding position of the electronic component 30 has to be changed between the first storing part 21 and the second storing part 22.

Second, in both of the first storing part 21 and the second storing part 22, each side has two boundaries of the convex portion 24 and the concave portion 25 or two boundaries of the convex portion 27 and the concave portion 28. Thus, the convex and concave portions have to be finely formed. Hence, when the electronic component 30 is small in size or the accuracy of processing the tray is low, the tray 20 cannot be produced. Even if the tray 20 can be produced, the concave portions 25 and 28 are small in size and thus the electronic component 30 cannot be picked up through the concave portions 25 and 28.

Further, in the conventional tray 20, when the electronic component 30 is supported in the first storing part 21, the L-shaped convex portions 24 are brought into contact with the corners of the electronic component 30 to regulate the position of the electronic component 30. However, when the electronic component 30 is supported in the second storing part 22, the flat convex portions 27 are brought into contact around the center of the electronic component 30 to regulate the position of the electronic component 30, resulting in a somewhat large rattle of the electronic component 30.

Another problem is that the tray 20 cannot be formed into a soft tray.

A soft tray cannot have different convex and concave portions on both sides like the tray 20. In a soft tray, the unevenness on a back surface is always similar to that of a main surface. By forming two soft trays, that is, by forming a first tray having a shape of a main surface and a second tray having a shape of a back surface, a structure similar to the tray 20 can be obtained. However, as described above, fine processing cannot be performed on a soft tray, and thus the foregoing three problems become more serious.

Moreover, in a soft tray, the unevenness of a back surface is always similar to that of a main surface but a shape displacement occurs according to a plate thickness. Hence, it is difficult to stack soft trays. When soft trays are stacked, it is difficult to pick up an electronic component interposed between the soft trays.

The present invention is devised to solve the problems, and has an object to provide a storing tray and a storing device whereby an object such as an electronic component to be stored can be picked up in a preferred manner and a plurality of stored objects can be flipped and transferred at once. The present invention has another object to form the storing tray as a soft tray.

DISCLOSURE OF THE INVENTION

In order to solve the problems, a storing tray of the present invention comprises a storing part on its main surface, the storing part comprising a storing base where an object to be stored is placed, a convex portion formed along the outer periphery of the storing base so as to protrude upward more than the storing base, and a concave portion formed along the outer periphery of the storing base to be recessed downward more than the storing base, wherein the storing tray has an uneven back surface opposite in shape to the main surface.

Further, a storing tray of the present invention comprises a storing part on its main surface, the storing part comprising a storing base where an object to be stored is placed, a convex portion formed along the outer periphery of each of a pair of corners diagonal to each other on the storing base, the convex portion protruding upward more than the storing base, and a concave portion formed along the outer periphery of each of the other pair of corners diagonal to each other on the storing base, the concave portion being recessed downward more than the storing base, wherein the storing tray has an uneven back surface opposite in shape to the main surface.

Moreover, in each configuration of the storing trays, the convex portion and the concave portion are formed with shared ends so as to surround the storing base.

Further, the boundaries of the storing base, the convex portion, and the concave portion are all formed as inclined planes.

The boundary of the convex portion and the concave portion is disposed at the center of each side of the storing base.

The boundaries of the storing base, the convex portion, and the concave portion are all formed as inclined planes. The storing base has, at the pair of corners diagonal to each other on the storing base, ends disposed outside the external shape of the object to be stored, and the storing base has, at the other pair of corners, ends disposed inside the object to be stored.

The convex portion and concave portion surrounding the storing base are symmetrically protruded and recessed with respect to the top surface of the storing base, and are symmetrically arranged with respect to a plane perpendicular to the top surface of the storing base, the plane passing through the center of the storing base.

The storing base has a concave portion formed therein.

The concave portion in the storing base has a back surface lower than the back surface of the concave portion on the outer periphery of the storing base.

The storing base has a through hole formed therein.

The through hole is punched out in the concave portion in the storing base from the back surface to the main surface of the storing base.

The concave portion of the storing base has a convex portion formed therein to be lower than the top surface of the storing base, and the through hole is formed on the end of the convex portion.

The concave portion on the outer periphery of the storing base forms a gap with the adjacent convex portion, the gap serving as an insertion portion of a clamping claw for placing and removing the object to be stored on the storing base.

Another storing device of the present invention comprises a plurality of stacked storing trays, wherein a first storing tray and a second storing tray are vertically stacked, and each of the storing trays comprises a storing part on its main surface. The storing part comprises a storing base where an object to be stored can be placed, a convex portion formed along the outer periphery of each of a pair of corners diagonal to each other on the storing base, the convex portion protruding upward more than the storing base, and a concave portion formed along the outer periphery of each of the other pair of corners diagonal to each other on the storing base. The concave portion is recessed downward more than the storing base, each of the storing trays has an uneven back surface opposite in shape to the main surface, the main surface of the first storing tray and the main surface of the second storing tray are similar in shape, the convex portion and the concave portion on the main surface of the first storing tray are engaged with the convex portion and the concave portion on the back surface of the second storing tray when the first storing tray and the second storing tray are stacked with their main surfaces facing the same direction, and the object to be stored is held between the storing base of the first storing tray and a back surface of the storing base of the second storing tray.

Still another storing device of the present invention comprises a plurality of stacked storing trays, wherein a first storing tray and a second storing tray are vertically stacked, and each of the storing trays comprises a storing part on its main surface. The storing part comprises a storing base where an object to be stored can be placed, a convex portion formed along the outer periphery of each of a pair of corners diagonal to each other on the storing base, the convex portion protruding upward more than the storing base, and a concave portion formed along the outer periphery of each of the other pair of corners diagonal to each other on the storing base. The concave portion is recessed downward more than the storing base, each of the storing trays has an uneven back surface opposite in shape to the main surface, the main surface of the first storing tray and the main surface of the second storing tray are mirror symmetrical to each other, the convex portion and the concave portion on the main surface of the first storing tray are engaged with the convex portion and the concave portion on the main surface of the second storing tray when the first storing tray and the second storing tray are stacked with the main surfaces facing each other, and the object to be stored is held between the storing base of the first storing tray and a back surface of the storing base of the second storing tray.

According to the storing tray of the present invention, the uneven main surface and back surface, on which the storing part is disposed, are opposite in shape. Thus, the storing device can be constituted of the plurality of stacked storing trays and an object can be stored between the storing trays. The uneven storing tray can be configured as a soft tray.

The first storing tray and the second storing tray are formed to be mirror symmetrical to each other, so that the first storing tray and the second storing tray can be freely stacked to constitute the storing device and an object can be stored between the storing trays.

DESCRIPTION OF THE EMBODIMENTS

An embodiment of the present invention will be discussed below in accordance with the accompanying drawings.

Figure 1A:
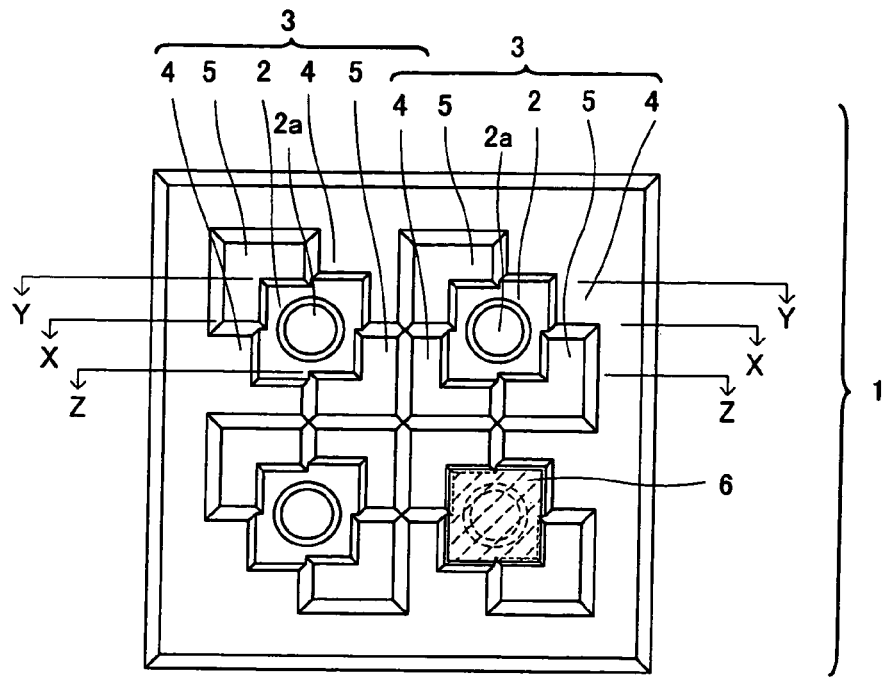
FIGS. 1A to 1D are structural diagrams showing a first storing tray of the present invention.
Figure 1B:
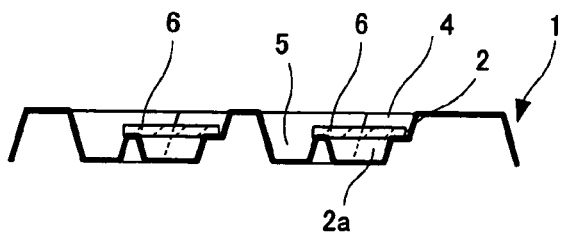
Figure 1C:
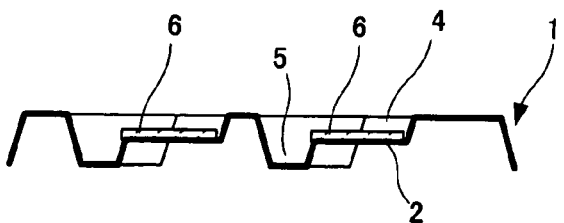
Figure 1D:
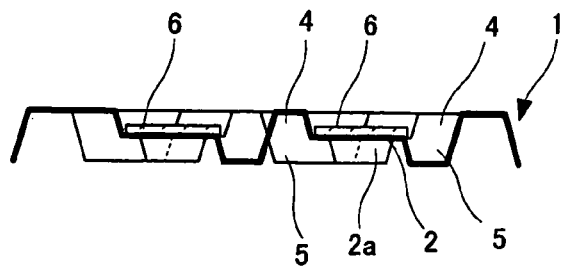
Figure 2A:
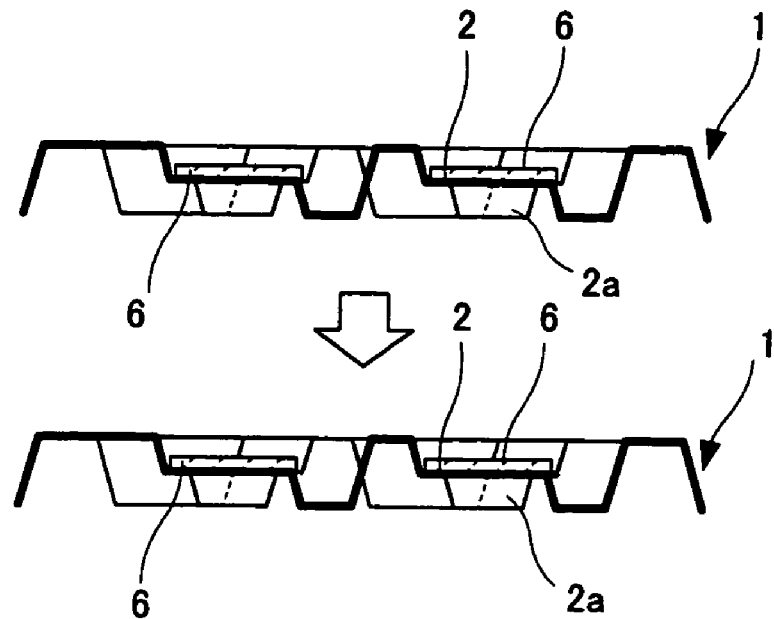
FIGS. 2A and 2B are sectional views showing a storing device in which the first storing trays are stacked.
Figure 2B:
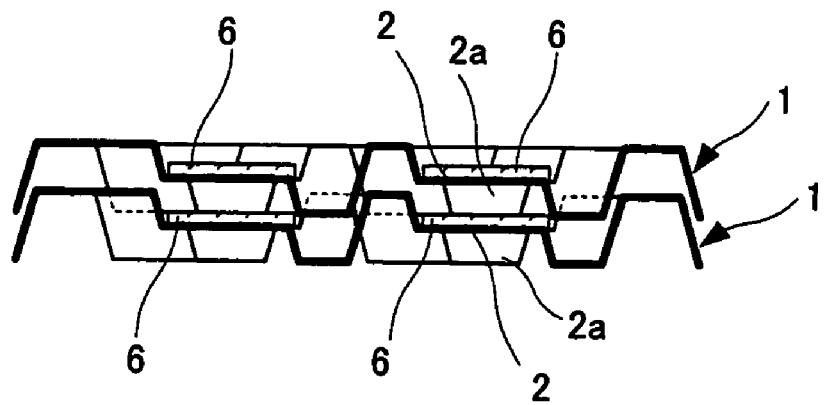

FIG. 1A is a plan view showing a first storing tray of the present invention. FIGS. 1B, 1C, and 1D are sectional views of the first storing tray taken along lines X-X, Y-Y, and Z-Z of FIG. 1A, respectively. FIGS. 2A and 2B are sectional views showing a storing device of the present invention, in which the first storing trays are stacked.

Figure 3A:
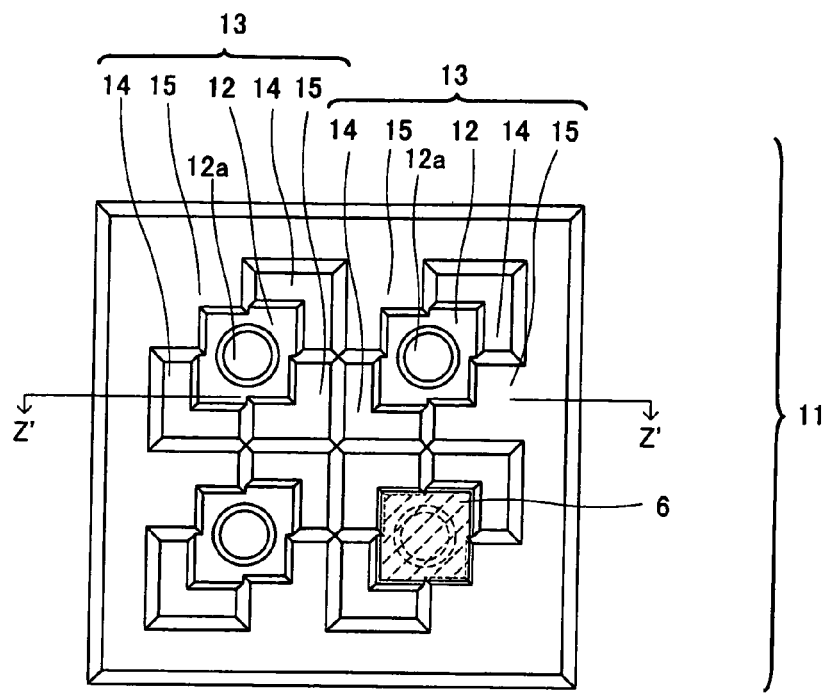
FIGS. 3A to 3D are a structural diagram showing a second storing tray of the present invention and sectional views showing a storing device in which the second storing trays are stacked.
Figure 3B:
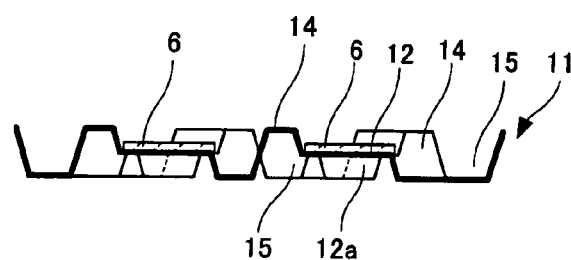
Figure 3C:
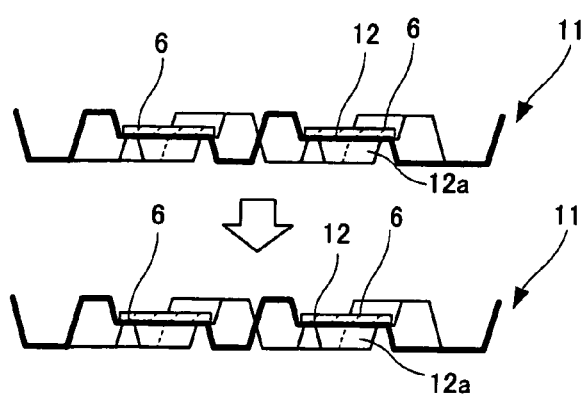
Figure 3D:
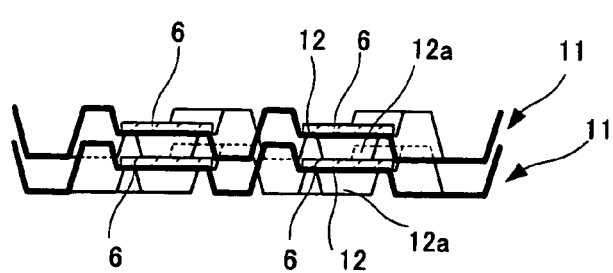

FIG. 3A is a plan view showing a second storing tray of the present invention. FIG. 3B is a sectional view of the second storing tray taken along line Z'-Z' of FIG. 3A. FIGS. 3C and 3D are sectional views showing a storing device of the present invention, in which the second storing trays are stacked.

Figure 4A:
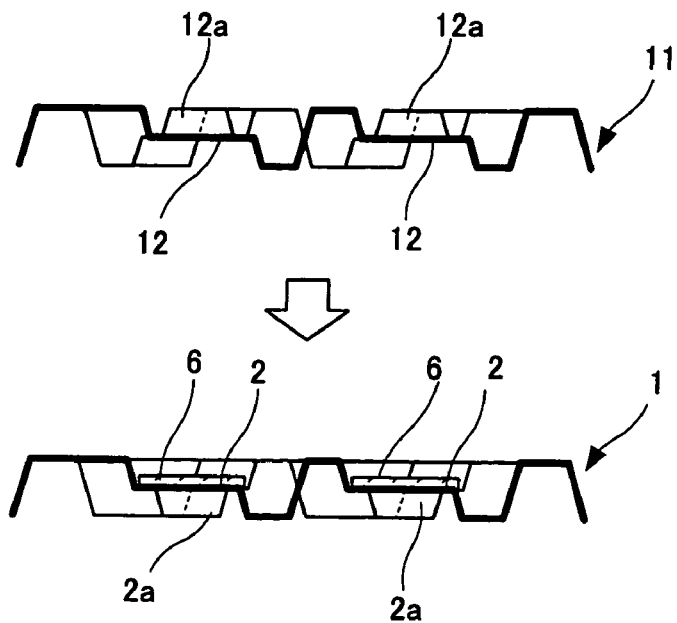
FIGS. 4A to 4C are sectional views showing a storing device in which the first storing tray and the second storing tray are stacked.
Figure 4B:
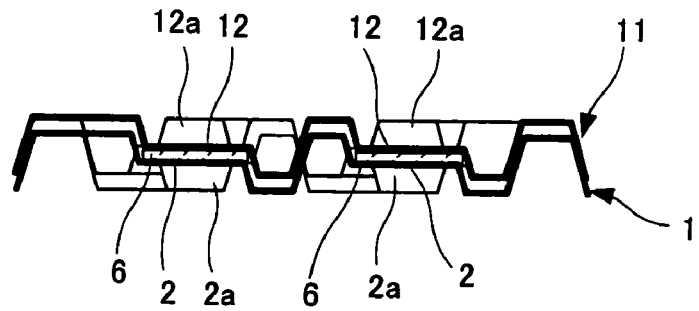
Figure 4C:
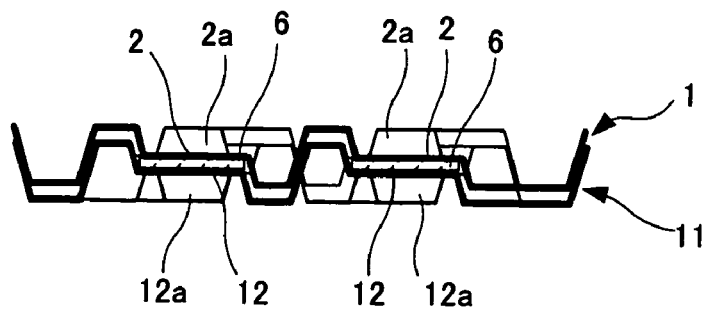

FIGS. 4A to 4C are sectional views showing a storing device of the present invention. The storing device is constituted of the first storing tray and the second storing tray.

Figure 5A:
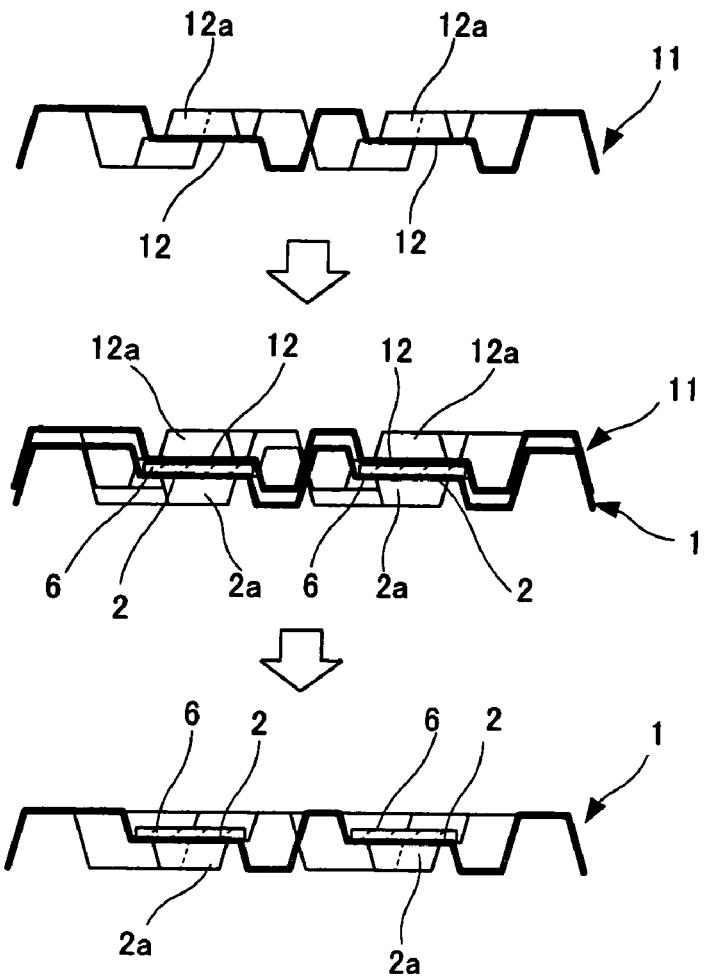
FIGS. 5A to 5B are sectional views showing another storing device in which the first storing tray and the second storing tray are stacked.
Figure 5B:
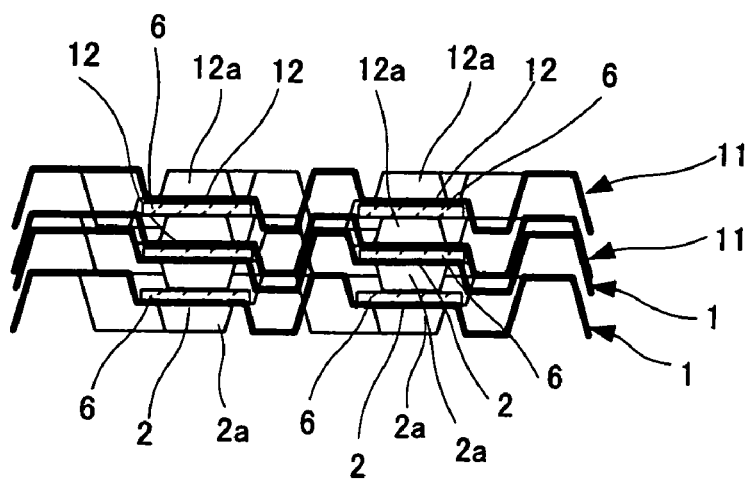

FIGS. 5A and 5B are sectional views showing another storing device of the present invention. The storing device is constituted of the first storing tray and the second storing tray.

In the sectional views, cross sections are indicated by thick lines. For brevity, the outermost lines of the storing trays are omitted in the cross sectional views.

The first storing tray 1 shown in FIG. 1 is configured as a soft tray. As in the conventional art, the first storing tray 1 is fabricated by vacuum forming in which a plate made of a plastic such as polystyrene is pressed to a die by pulling a vacuum between the die and one side of the plate while the plate is softened at a high temperature, so that the plate is molded in a bent manner. Thus, the first storing tray 1 has a shape unique to a soft tray. The back surface of the first tray 1 is similar in shape to a main surface thereof and is displaced by a plate thickness. However, the first storing tray 1 may be configured as a hard tray having similar concave and convex portions.

On the first storing tray 1, four storing parts 3 having storing bases 2 are formed and arranged in rows and columns. The storing base 2 is almost shaped like a rectangular corresponding to an object to be stored and has a top surface for storing the object to be stored. The top surface is positioned almost at the halfway point of the thickness of the tray.

The storing parts 3 formed on the upper right area and the lower left area of FIG. 1 are symmetrical with respect to the central axis along the thickness direction of the tray. Convex portions 4 protruding more than the storing base 2 are formed on the outer periphery of a pair of corners (a corner close to the central axis and a corner diagonal to the corner) which are diagonal to each other on the storing base 2. Concave portions 5 recessed more than the storing base 2 are formed on the outer periphery of the other pair of corners.

The storing parts 3 formed on the lower right area and the upper left area of FIG. 1 are symmetrical with respect to the central axis along the thickness direction of the tray. Concave portions 5 recessed more than the storing base 2 are formed on the outer periphery of a pair of corners (a corner close to the central axis and a corner diagonal to the corner) which are diagonal to each other on the storing base 2. Convex portions 4 protruding more than the storing base 2 are formed on the outer periphery of the other pair of corners.

In each of the storing parts 3, the convex portions 4 and concave portions 5 surrounding the storing base 2 are flipped vertically and horizontally with respect to the top surface of the storing base 2, and the concave portions on the rear surface are substantially congruent with the convex portions on the main surface. That is, the convex portions 4 and concave portions 5 surrounding the storing base 2 protrude and are recessed symmetrically with respect to the top surface of the storing base 2, and are symmetrical in the horizontal and vertical directions with respect to planes perpendicular to the top surface of the storing base 2 (in this case, two planes passing through the center of each side of the storing base 2).

The convex portions 4 are equal in height and the concave portions 5 are equal in depth. Corners are shared by the adjacent convex portions 4 and concave portions 5. The convex portions 4 are seamlessly formed in the outer peripheral area of the storing tray 1. The outer edge of the storing tray 1 is bent diagonally below.

In each of the storing parts 3, the boundary of the convex portion 4 and the concave portion 5 is disposed at the center of each side of the storing base 2. The boundaries between the storing base 2, the convex portion 4, and the concave portion 5 have inclined planes.

On a pair of corners around which the convex portions 4 are formed, the ends of the storing base 2 (the positions of the boundaries of the inclined planes and the storing base 2) are disposed somewhat outside the external shape of a rectangular electronic component 6 to be stored. On the other pair of corners around which the concave portions 5 are formed, the ends of the storing base 2 are disposed somewhat inside the external shape of the electronic component 6.

A concave portion 2a shaped like a truncated cone is formed at the center of the storing base 2. The depth of the concave portion 2a in the storing base 2 is set so as to make its back surface lower than the concave portions 5 on the outer periphery of the storing base 2 (enlarged in FIG. 7, discussed later).

As shown in FIGS. 1A to 1D, the electronic component 6 is placed and stored on the storing base 2 of the storing part 3 in the first storing tray 1.

As described above, in the storing device where the first storing trays 1 are stacked, the unevenness on the back surface of the upper tray 1 is similar to that of the main surface of the lower tray 1 and is displaced by a plate thickness as shown in FIGS. 2A and 2B and the boundaries of the storing base 2, the convex portion 4, and the concave portion 5 have inclined planes. Thus, the convex portions 4 and the concave portions 5 of the upper and lower trays 1 are stacked and the back surface of the concave portion 2a of the storing base 2 in the upper tray 1 presses the electronic component 6 placed on the storing base 2 of the lower tray 1.

A second storing tray 11 shown in FIG. 3 is configured as a soft tray like the first storing tray 1 and is mirror symmetrical to the first storing tray 1.

To be specific, in the second storing tray 11, the storing parts 13 formed on the upper right area and the lower left area of FIG. 3 are symmetrical with respect to the central axis along the thickness direction of the tray. Convex portions 14 protruding more than a storing base 12 are formed on the outer periphery of a pair of corners (a corner close to the central axis and a corner diagonal to the corner) which are diagonal to each other on the storing base 12. Concave portions 15 recessed more than the storing base 12 are formed on the outer periphery of the other pair of corners.

Storing parts 13 formed on the lower right area and the upper left area of FIG. 3 are symmetrical with respect to the central axis along the thickness direction of the tray. Concave portions 15 recessed more than the storing base 12 are formed on the outer periphery of a pair of corners (a corner close to the central axis and a corner diagonal to the corner) which are diagonal to each other on the storing base 12. Convex portions 14 protruding more than the storing base 12 are formed on the outer periphery of the other pair of corners.

The convex portions 14 are equal in height and the concave portions 15 are equal in depth. Corners are shared by the adjacent convex portions 14 and adjacent concave portions 15. The concave portions 15 are seamlessly formed in the outer peripheral area of the storing tray 11. The outer edge of the storing tray 11 is bent diagonally above.

In each of the storing parts 13, the boundary of the convex portion 14 and the concave portion 15 is disposed at the center of each side of the storing base 12. The boundaries between the storing base 12, the convex portion 14, and the concave portion 15 have inclined planes.

On a pair of corners around which the convex portions 14 are formed, the ends of the storing base 12 (the positions of boundaries of the inclined planes and the storing base 12) are disposed somewhat outside the external shape of the rectangular electronic component 6 to be stored. On the other pair of corners around which the concave portions 15 are formed, the ends of the storing base 12 are disposed somewhat inside the external shape of the electronic component 6.

A concave portion 12a shaped like a truncated cone is formed at the center of the storing base 12. The depth of the concave portion 12a in the storing base 12 is set so as to make its back surface lower than the concave portions 15 on the outer periphery of the storing base 12.

As shown in FIGS. 3A and 3B, the electronic component 6 is placed and stored on the storing base 12 of the storing part 13 in the second storing tray 11.

As described above, in the storing device where the second storing trays 11 are stacked, the unevenness on the back surface of the upper tray 11 is similar to that of the main surface of the lower tray 11 and is displaced by a plate thickness as shown in FIGS. 3C and 3D and the boundaries of the storing base 12, the convex portion 14, and the concave portion 15 have inclined planes. Thus, the convex portions 14 and the concave portions 15 of the upper and lower trays 11 are stacked and the back surface of the concave portion 12a of the storing base 12 in the upper tray 11 presses the electronic component 6 placed on the storing base 12 of the lower tray 11.

As shown in FIG. 4A, a pair of the first storing tray 1 and the second storing tray 11 can be used as a storing device. In this case, as described above, the first storing tray 1 and the second storing tray 11 are almost mirror symmetrical to each other. Thus, the convex portion 14 and the concave portion 15 of the upper second tray 11 and the convex portion 4 and the concave portion 5 of the lower first tray 1 are stacked, and the electronic component 6 is interposed between the storing base 2 and the storing base 12. Two or more pairs of the storing trays 1 and 11 may be stacked as a storing device.

FIG. 4B shows that the electronic component 6 is placed on the storing base 2 of the first storing tray 1. When the storing device is vertically flipped, the electronic component 6 is placed on the storing base 12 of the second storing tray 11 as shown in FIG. 4C. That is, the storing direction can be freely changed at once so as to place the electronic component 6 either face up or down. Accordingly, the electronic component 6 can be transferred between the first storing tray 1 and the second storing tray 11.

As shown in FIGS. 5A and 5B, the first storing trays 1 and the second storing trays 11 may be stacked in a mixed manner as a storing device.

Figure 6A:
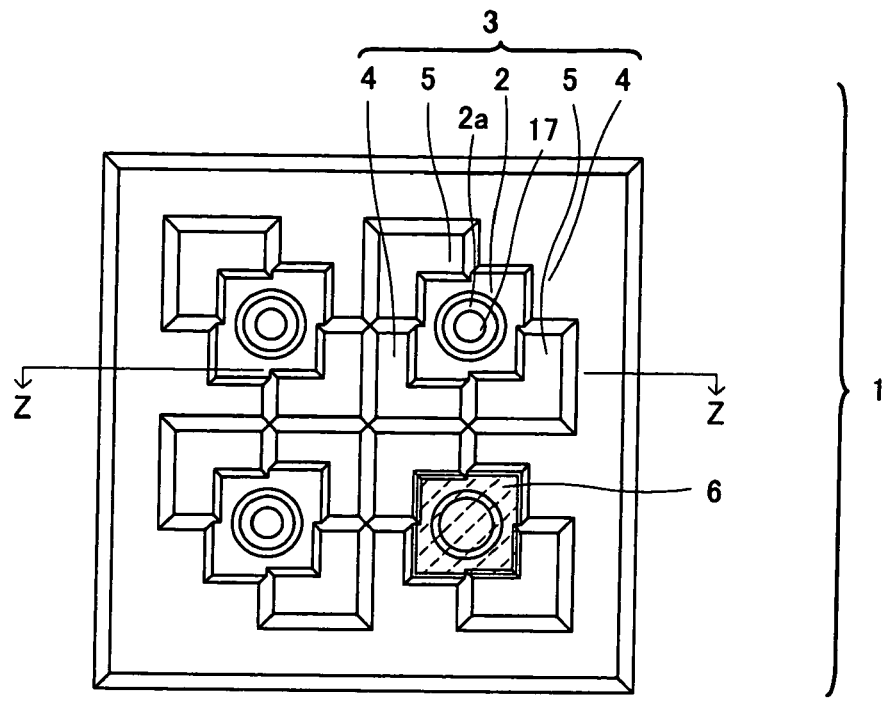
FIGS. 6A to 6C are structural diagrams showing a variation of the first storing tray.
Figure 6B:
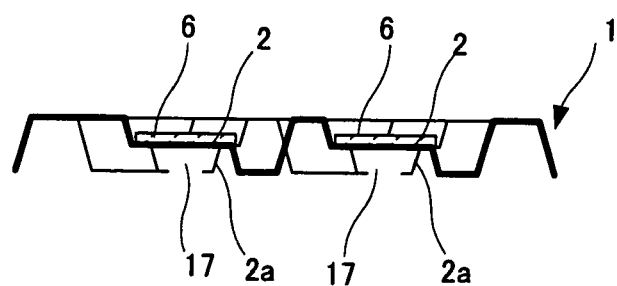
Figure 6C:
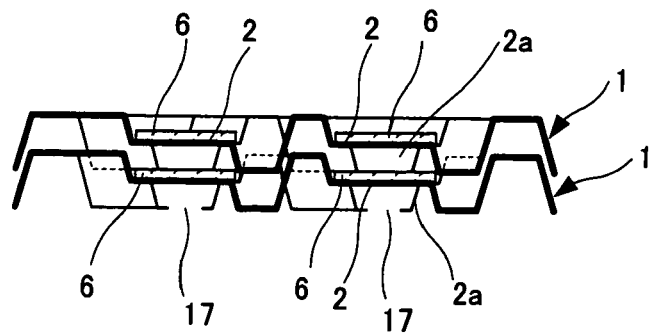

FIG. 6 shows a variation of the first storing tray 1. FIG. 6A is a plan view showing the first storing tray 1. FIGS. 6B is a sectional view of the first storing tray 1 taken along line Z-Z of FIG. 6A. FIG. 6C is a sectional view showing a storing device where the storing trays are stacked.

In the first storing tray 1, a through hole 17 is formed on the bottom of a concave portion 2a in a storing base 2. Thus, when electronic components 6 are stored between the upper and lower trays and are transferred at once, the through holes 17 act as air holes and thus the electronic components 6 do not stick to the tray. Further, during an electrical inspection and packaging of the electronic component 6, the through hole 17 allows the passage of light from a sensor for deciding the presence or absence of the electronic component 6. A similar through hole may be formed on the concave portion 12a in the storing base 12 of the second storing tray 11.

The through hole 17 is punched from the back to the main surface of the storing base 2 (concave portion 2a). When the first storing trays 1 are stacked, the back surface of the concave portion 2a presses the electronic component 6. The through hole 17 is punched from the back to prevent burrs made by the formation of the through hole 17 from being in contact with the electronic component 6 and damaging the electronic component 6.

Figure 7:
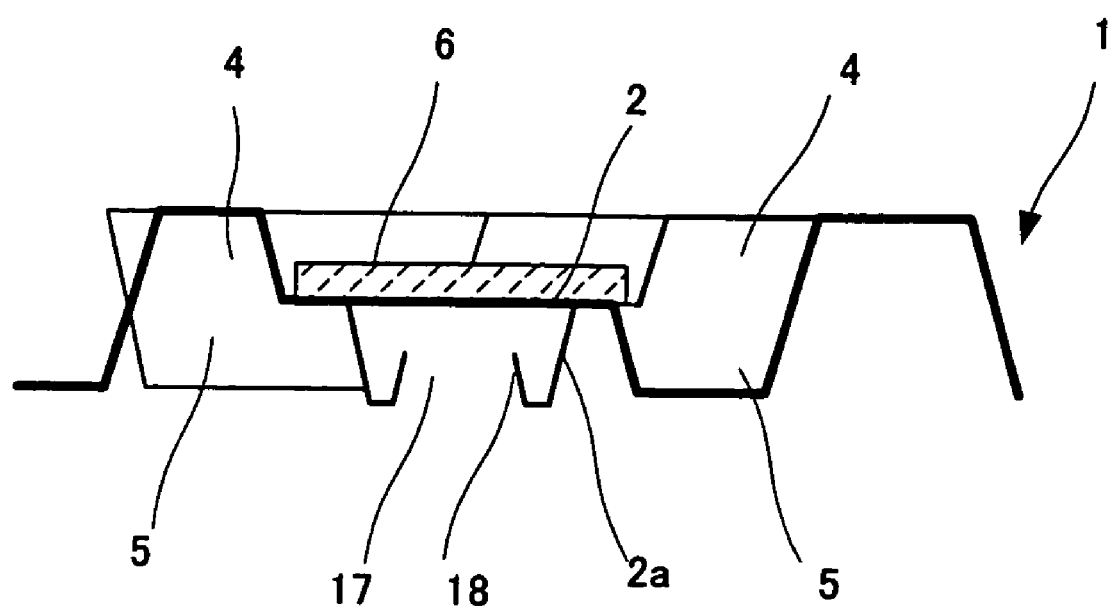
FIG. 7 is a structural diagram showing another variation of the first storing tray.

As shown in FIG. 7, it is also desirable to form, in the concave portion 2a, a convex portion 18 having a height smaller than the depth of the concave portion 2a and form the through hole 17 on the end of the convex portion 18. With this configuration, the stacked storing trays do not bring the through hole 17 into contact with the electronic component 6.

Thus, even when burrs appear during the formation of the through hole 17, the electronic component 6 is not damaged.

However, when a method of removing burrs with a file or the like is used after formation, the electronic component 6 is not seriously damaged by burrs, or burrs are unlikely to damage the electronic component 6, a through hole may be directly formed (not shown) on the storing base 2 without forming the concave portion 2a in the storing base 2.

FIG. 8 shows another variation of the first storing tray 1. FIGS. 8A and 8B are a plan view and a sectional view of the first storing tray 1. FIGS. 8C and 8D are sectional views showing a storing device where the storing trays 1 are stacked.

Figure 8A:
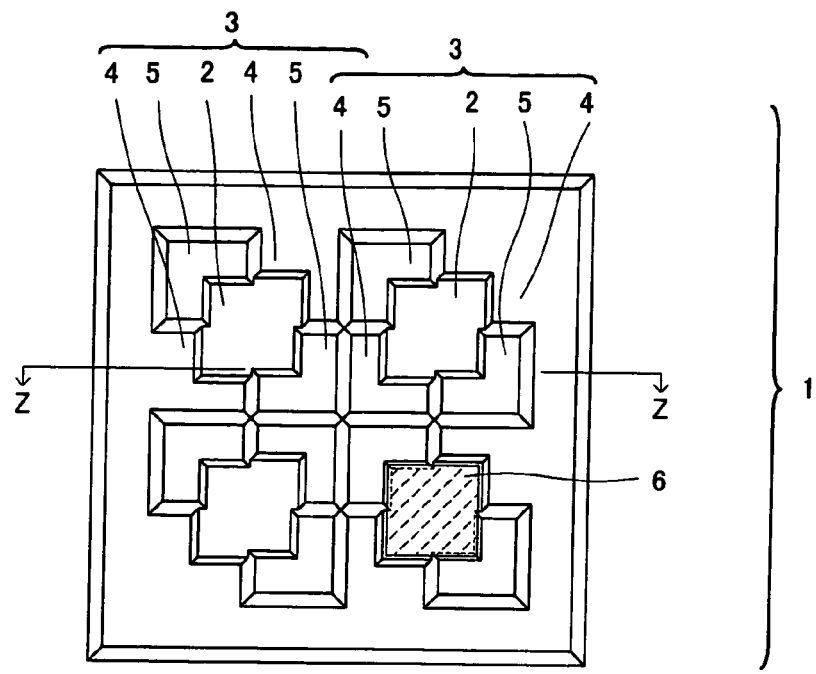
FIGS. 8A to 8D are structural diagrams showing still another variation of the first storing tray.
Figure 8B:
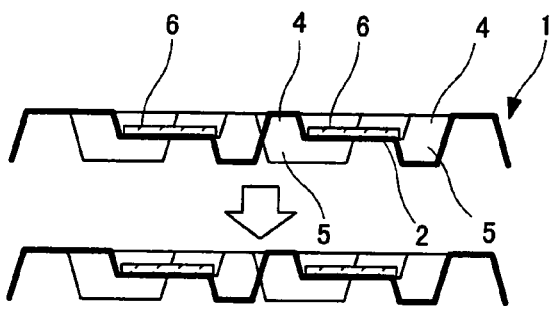
Figure 8C:
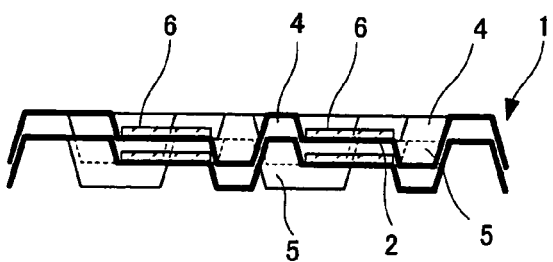
Figure 8D:
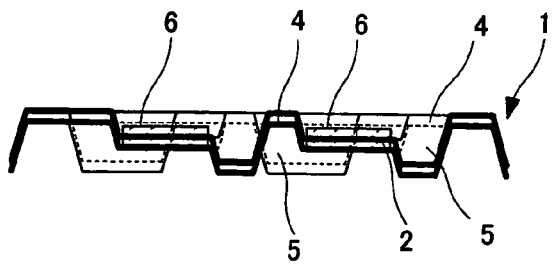
Figure 9A:
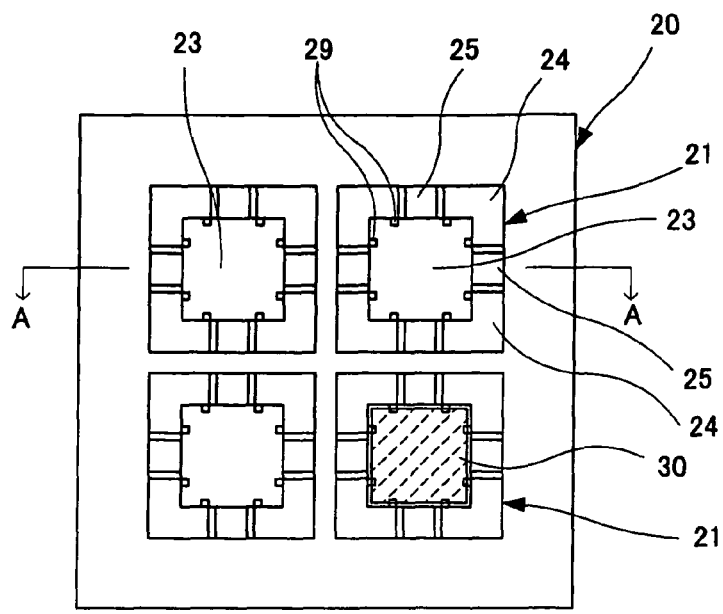
FIGS. 9A to 9D are structural diagrams showing a conventional storing tray.
Figure 9B:
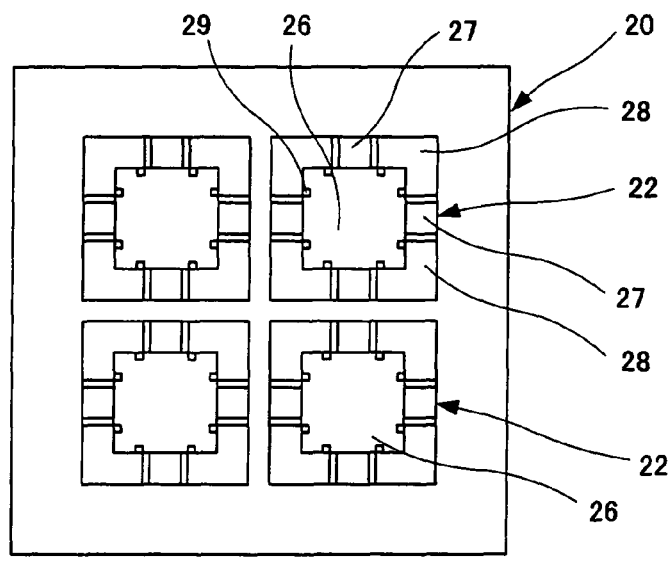
Figure 9C:
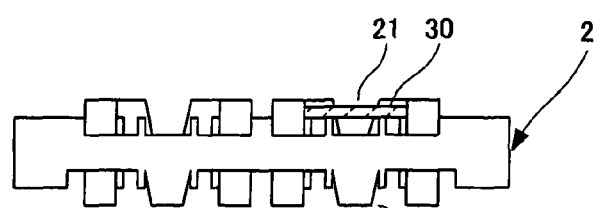
Figure 9D:
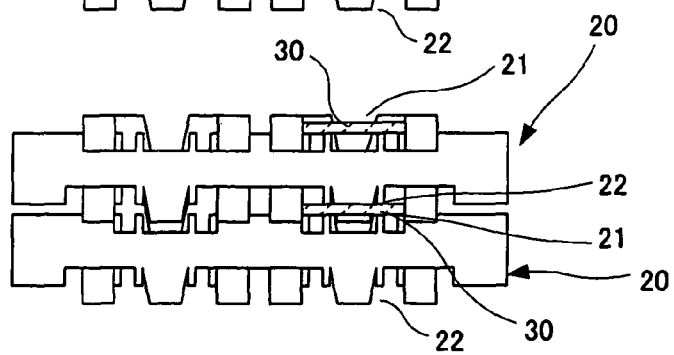

A storing base 2 of the first storing tray 1 does not have the above-described concave portion 2a. As described above, also in the storing device where the first storing trays 1 are stacked in the same direction, the unevenness on the back surface of the upper tray 1 is similar to that of the main surface of the lower tray 1 and is displaced by a plate thickness, and the boundaries of the storing base 2, a convex portion 4, and a concave portion 5 have inclined planes. Thus, the convex portions 4 and the concave portions 5 of the upper and lower trays 1 are stacked and the electronic component 6 is stored between the back surface of the storing base 2 of the upper tray 1 and the top surface of the lower tray 1. FIG. 8C shows that there is less overlap between the trays 1 when an electronic component 6 is large. FIG. 8D shows that there is more overlap between the trays 1 when the electronic component 6 is small. The same effect can be obtained by the second storing trays 11 formed in a similar manner.

The following will discuss advantages of the first storing tray 1 and the second storing tray 11 in comparison with the conventional trays.

1) Each of the first storing tray 1 and the second storing tray 11 has a main surface and a back surface which are opposite in shape and thus can be used as a lightweight and inexpensive soft tray.

2) In the first storing tray 1 and the second storing tray 11 or in the storing parts 3 and 13, the convex portions 4 are formed on the outer periphery of a pair of corners which are diagonal to each other on the storing bases 2 and 12, the concave portions 5 are formed on the outer periphery of the other pair of corners which are adjacent to the former pair of corners, and the uneven shapes on the outer periphery of the storing bases 2 and 12 are completely similar to each other. Thus, in both of the first storing tray 1 and the second storing tray 11, the electronic component 6 can be placed and removed in the same direction with the same method.

In this case, on the peripheries of the storing bases 2 and 12, only one boundary of the convex portion 4 and the concave portion 5 or only one boundary of the convex portion 14 and the concave portion 15 is present on each side of the storing bases 2 and 12, so that the uneven shape is simplified. Thus, it is possible to increase the size of the concave portions 5 and 15 which are spaces for clamping claws for placement and removal.

Therefore, it is possible to simplify the configuration and mechanism of pickup equipment for placement and removal as well as considerably reduce the trouble of designing the first storing tray 1 and the second storing tray 11, thereby achieving low cost.

The electronic component 6 placed on either of the storing bases 2 and 12 has two corners in contact with the convex portions 4 or the convex portions 14, thereby minimizing the unsteadiness of the electronic component 6.

3) In the first storing tray 1 and the second storing tray 11 or in the storing sections 3 and 13, the convex portions 4 and 14 and the concave portions 5 and 15 are formed with shared ends so as to surround the storing bases 2 and 12. When the convex and concave portions are combined, walls are completely integrated so as to surround a product, so that the product can be stored with stability. Further, it is possible to store products with the maximum density.

4) The boundaries of the storing base 2, the convex portion 4, and the concave portion 5 and the boundaries of the storing base 12, the convex portion 14, and the concave portion 15 all have inclined planes. Thus, in any of a combination of the first storing trays 1, a combination of the second storing trays 11, and a combination of the first storing tray 1 and the second storing tray 11, the upper and lower storing trays can be stacked with the convex portions and concave portions engaged with each other, thereby saving a space.

Inclined planes are also formed on the inner edges of the convex portions 4 and 14 facing the storing bases 2 and 12 in the storing sections 3 and 13. Thus, even when the electronic components 6 rattle a little in the storing sections 3 and 13 during placement and so on, the electronic components 6 can be always disposed on the storing bases 2 and 12 in a proper manner.

Also when the first storing tray 1 and the second storing tray 11 are stacked, the walls of the convex portions 4 and 14 have inclined planes in either of the storing tray 1 and 11, and the planes of the storing bases 2 and 12 are disposed at the intersections of the inclined planes. Thus, the electronic component 6 can be stably stored and transferred between the upper and lower trays 1 and 11.

When the inclined plane has a large angle of inclination, the storing trays can be fit into each other more tightly. This means that the convex portions 4 and 14 become lower when the storing trays 1 and 11 have constant external dimensions, so that the electronic components 6 are likely to pop up from the storing parts 3 and 13. A small angle of inclination results in a loose fit between the storing trays 1 and 11, so that the electronic component cannot be interposed between the upper and lower storing trays. A proper angle of inclination is about 10 to 20°. The walls may not have inclined planes.

5) The boundaries of the storing base 2, the convex portion 4, and the concave portion 5, and the boundaries of the storing base 12, the convex portion 14, and the concave portion 15 all have inclined planes; meanwhile the ends of the storing bases 2 and 12 are set somewhat outside the external shape of the electronic component 6 on a pair of corners around which the convex portions 4 and 14 are formed, and the ends of the storing bases 2 and 12 are set somewhat inside the external shape of the electronic component 6 on the other pair of corners around which the concave portions 5 and 15 are formed. Thus, the electronic component 6 can be placed and removed smoothly by holding the outer edge of the electronic component 6, and the clamping claws are not brought into contact with the storing bases 2 and 12. In addition to the configuration where the convex portions 4 or 14 are in contact with the two corners of the electronic component 6, this configuration makes it possible to regulate the position of the electronic component 6 during storing and positively hold the electronic component 6 with ease during placement and removal.

6) Since the concave portions 2a and 12a are formed in the storing bases 2 and 12, in the case of a COB component having a convex portion such as a chip coat area, the convex portion can be stored in the concave portions 2a and 12a in a rational manner. Further, when the storing trays 1 and 11 are stacked, the electronic components 6 can be pressed by the back surfaces of the concave portions 2a and 12a.

Further, the depths of the concave portions 2a and the 12a are set so as to have back surfaces lower than those of the concave portions 5 and 15 formed on the outer peripheries of the storing parts 3 and 13. Thus, it is possible to solve a problem unique to a soft tray, to be specific, a problem that the electronic component 6 is stuck between the storing trays because the unevenness of the back surface is similar to that of the main surface and the shape of the back surface is displaced by a plate thickness.

The electronic component 6 is stuck between the storing trays as follows: the convex and concave portions are tightly engaged with each other so that the storing trays 1 and 11 become hard to separate, and the electronic component 6 is stuck into the convex and concave portions on the back surface of the upper storing tray 1 or 11. The latter phenomenon is likely to occur in the following state: the electronic component 6 has a small size and it is necessary to reduce a distance between the wall of the convex portion 4 and the electronic component 6 to prevent the electronic component 6 from rotating in the storing part 3. The above-described specifications are effective in preventing the electronic component 6 from being stuck.

The electronic component 6 is unlikely to be stuck when the electronic component 6 is sufficiently large in size and there is a sufficient distance between the electronic component 6 and the wall of the convex portion 4 around the storing base 2, and a shape displacement between both sides of the tray 1 according to a plate thickness is not a serious problem. Thus, as in the storing tray 1 of FIG. 8, a storing function can be obtained on both sides of the storing part 3.

As described above, the main surfaces and the back surfaces of the first storing tray 1 and the second storing tray 11 are opposite in shape and are mirror symmetrical to each other. Thus, the first storing tray 1 and the second storing tray 11 can be freely stacked to store and package the electronic components 6. For example, only the first storing trays 1 can be stacked, only the second storing trays 11 can be stacked, the first storing trays 1 and the second storing trays 11 can be stacked in a mixed manner, or two or more pairs of the first storing trays 1 and the second storing trays 11 can be stacked.

When a pair of the first storing tray 1 and the second storing tray 11 is used as a storing device, the storing direction can be freely changed at once so as to place the electronic component 6 either face up or down. Accordingly, the electronic component 6 can be transferred between the first storing tray 1 and the second storing tray 11.

Considering the storing trays capable of transferring the electronic components 6 while freely changing the storing direction at once, only one kind of storing tray is necessary for a hard tray as described in the conventional example; whereas a soft tray requires two kinds of the first storing tray 1 and the second storing tray 11.

However, a soft tray has a number of advantages: a die for a soft tray can be manufactured in a period one tenth or shorter than a die for a hard tray, a development period is short, and the unit price of a soft tray is one tenth or lower than that of a hard tray.

When two kinds of storing trays are stacked and packaged in pairs, the number of trays is doubled as compared with the stacking and packaging of hard trays of one kind. Thus, it is conceivable that a total thickness of a packaging unit may increase. However, the first storing tray 1 and the second storing tray 11 can be stacked in the above-described manner and thus the packaging unit can be equal in total thickness to the packaging unit of a conventional hard tray.

In the foregoing embodiment, for simple explanation, the first storing tray 1 and the second storing tray 11 are mirror symmetrical to each other, and the storing bases 2 and 12, the convex portions 4 and 14, and the concave portions 5 and 15 of the storing parts 3 and 13 are completely equal in height, shape, and dimensions. The storing parts 3 and 13 do not always have to be completely the same. The same effect can be obtained by making arrangements as necessary for facilities and the electronic component 6 to be stored as long as the arrangements are within the scope of the design concept of the present invention.

In the foregoing embodiment, for simple explanation, the first storing tray land the second storing tray 11 are configured so as to store the rectangular electronic component 6 of the simplest shape. The configuration of the present invention is applicable even when the electronic component 6 is circular, polygonal, and asymmetrical.

The electronic component 6 to be stored includes a variety of semiconductor electronic components such as packaged semiconductor devices of COB, QFP, BGA, LGA, CSP, and so on. Electronic components other than a semiconductor package and various products having electronic components can be stored in the storing tray and the storing device of the present invention.

One or more kinds of storing trays of the present invention are stacked so as to store an object between the trays. The storing trays can be used as a storing device for various components and products starting with electronic components such as a semiconductor package, and are available for various purposes.

What is claimed is:

1. A storing tray comprising a storing part on a main surface for storing an object, the storing tray having a rear surface opposite the main surface, the storing part comprising:
    a storing base having four corners on an outer periphery, a first pair of corners being diagonally opposite each other and a second pair of corners being diagonally opposite each other;
    convex portions each located along an outer periphery of each of the corners in the first pair of corners, a top surface of each of the convex portions being higher than a top surface of the storing base; and
    first concave portions each located along an outer periphery of each of the corners in the second pair of corners, a bottom surface of each of the first concave portions being lower than a bottom surface of the storing base,
    a second concave portion in the storing base,
    each of the convex portions having two parts extending in different directions from each other, said two parts forming a corner along an outer periphery of a respective corner of the first pair of corners on the storing base,
    the second concave portion in the storing base having a bottom surface lower than the bottom surface of each of the first concave portions on the outer periphery of the storing base,
    wherein a shape of the rear surface of the storing tray is congruent with a shape of the main surface of the storing tray.

2. The storing tray according to claim 1, wherein the convex portions and the first concave portions share ends, thereby surrounding the storing base.

3. The storing tray according to claim 1, wherein side edges of the storing base, each of the convex portions, and each of the first concave portions are inclined planes.

4. The storing tray according to claim 1, wherein a boundary between each of the convex portions and each of the first concave portions is located at a middle of a peripheral edge of the storing base.

5. The storing tray according to claim 1, wherein the second pair of corners is closer to a center of the storing base than an outer peripheral edge of an object therein, and the first pair of corners is farther from the center of the storing base than the outer peripheral edge of said object.

6. The storing tray according to claim 1, wherein each of the convex portions and each of the first concave portions are symmetrical with respect to the top surface of the storing base, and are symmetrical with respect to a plane perpendicular to the top surface of the storing base, the plane passing through a center of the storing base.

7. The storing tray according to claim 1, wherein a through hole is punched out in the second concave portion in the storing base from the rear surface to the main surface of the storing tray.

8. The storing tray according to claim 1, wherein the second concave portion of the storing base comprises a convex portion, a top surface of the convex portion in the second concave portion of the storing base being lower than the top surface of the storing base, and the convex portion in the second concave portion of the storing base comprises a through hole.

9. The storing tray according to claim 1, wherein each of the first concave portions defines a space with each of the convex portions, the space being for inserting a clamping claw for placing and removing said object on and from the storing base.

10. A storing device comprising a plurality of stacked storing trays including a first storing tray and a second storing tray vertically stacked one on the other, each of the storing trays comprising a storing part on a main surface thereof for storing an object, the storing part comprising:

a storing base having four corners on an outer periphery, a first pair of corners being diagonally opposite each other and a second pair of corners being diagonally opposite each other;

convex portions each located along an outer periphery of each of the corners in the first pair of corners, a top surface of each of the convex portions being higher than a top surface of the storing base;

first concave portions each located along an outer periphery of each of the corners in the second pair of corners, a bottom surface of each of the first concave portions being lower than a bottom surface of the storing base; and a second concave portion in the storing base., each of the convex portions on the storing base of each of the storing trays having two parts extending in different directions from each other, said two parts forming a corner along an outer periphery of a respective corner of the first pair of corners on the storing base of each of the storing trays, the second concave portion in the storing base of each of the storing trays having a bottom surface lower than the bottom surface of each of the first concave portions on the outer periphery of the storing base of each of the storing trays, wherein a shape of a rear surface of each of the storing trays is congruent with a shape of the main surface of each of the storage trays, the main surface of the first storing tray and the main surface of the second storing tray have a substantially similar shape, each of the convex portions on the main surface of the first storing tray is engaged with a respective concave portion on the rear surface of the second storing tray when the first storing tray and the second storing tray are stacked with the main surfaces thereof facing a same direction, and each of the first concave portions on the main surface of the first storing tray is engaged with a respective convex portion on the rear surface of the second storing tray when the first storing tray and the second storing tray are stacked with the main surfaces thereof facing a same direction, and an object may be held between the storing base of the first storing tray and a rear surface of the storing base of the second storing tray.

11. A storing device comprising a plurality of stacked storing trays including a first storing tray and a second storing tray vertically stacked one on the other, each of the storing trays comprising a storing part on a main surface thereof for storing an object, the storing part comprising:

a storing base having four corners on an outer periphery, a first pair of corners being diagonally opposite each other and a second pair of corners being diagonally opposite each other;

a convex portion located along an outer periphery of each of the corners in the first pair of corners, a top surface of the convex portion being higher than a top surface of the storing base; and a concave portion located along an outer periphery of each of the corners in the second pair of corners, a bottom surface of the concave portion being lower than a bottom surface of the storing base, wherein a rear surface of each of the storing trays has a shape that is congruent with a shape of the main surface of each of the storing trays, the main surface of the first storing tray and the main surface of the second storing tray are symmetrical mirror image shapes of each other, the convex portion on the main surface of the first storing tray is engaged with the concave portion on the main surface of the second storing tray when the first storing tray and the second storing tray are stacked with the main surfaces thereof facing each other, and the concave portion on the main surface of the first storing tray is engaged with the convex portion on the main surface of the second storing tray when the first storing tray and the second storing tray are stacked with the main surfaces thereof facing each other, and an object may be held between the storing base of the first storing tray and a main surface of the storing base of the second storing tray.

* * * * *